(12) United States Patent
Chen et al.

(10) Patent No.: US 9,397,189 B2
(45) Date of Patent: Jul. 19, 2016

(54) SEMICONDUCTOR STRUCTURE HAVING A METAL GATE WITH SIDE WALL SPACERS

(71) Applicant: UNITED MICROELECTRONICS CORP., Hsin-Chu (TW)

(72) Inventors: Yi-Wei Chen, Taichung (TW); Nien-Ting Ho, Tainan (TW); Chien-Chung Huang, Taichung (TW); Chin-Fu Lin, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/698,828

(22) Filed: Apr. 28, 2015

(65) Prior Publication Data
US 2015/0249142 A1 Sep. 3, 2015

Related U.S. Application Data

(62) Division of application No. 12/629,064, filed on Dec. 2, 2009, now Pat. No. 9,048,254.

(51) Int. Cl.
*H01L 29/66* (2006.01)
*H01L 21/28* (2006.01)
(Continued)

(52) U.S. Cl.
CPC ...... *H01L 29/66545* (2013.01); *H01L 21/2633* (2013.01); *H01L 21/28026* (2013.01); *H01L 21/28114* (2013.01); *H01L 29/401* (2013.01); *H01L 29/42372* (2013.01); *H01L 29/42376* (2013.01); *H01L 29/495* (2013.01);
(Continued)

(58) Field of Classification Search
CPC ............... H01L 29/66689; H01L 21/823468; H01L 21/28132; H01L 21/823864; H01L 29/6656; H01L 21/28026; H01L 21/28114; H01L 21/02697; H01L 29/6653
See application file for complete search history.

(56) References Cited

U.S. PATENT DOCUMENTS 6,348,385 B1  2/2002  Cha
6,376,888 B1  4/2002  Tsunashima
(Continued)

FOREIGN PATENT DOCUMENTS

CN    101027770 A    8/2007
TW    200924057     6/2009

OTHER PUBLICATIONS

P. Ranade et al., High Performance 35nm LGATE CMOS Transistors Featuring NiSi Metal Gate (FUSI), Uniaxial Strained Silicon Channels and 1.2nm Gate Oxide, IEEE, 2005, USA.

*Primary Examiner* — Phat X Cao
*Assistant Examiner* — Diana C Vieira
(74) *Attorney, Agent, or Firm* — Winston Hsu; Scott Margo

(57) ABSTRACT

A method of forming a semiconductor structure having a metal gate. Firstly, a semiconductor substrate is provided. Subsequently, at least a gate structure is formed on the semiconductor substrate. Afterwards, a spacer structure is formed to surround the gate structure. Then, an interlayer dielectric is formed. Afterwards, a planarization process is performed for the interlayer dielectric. Then, a portion of the sacrificial layer is removed to form an initial etching depth, such that an opening is formed to expose a portion of the spacer structure. The portion of the spacer structure exposed to the opening is removed so as to broaden the opening. Afterwards, remove the sacrificial layer completely via the opening. Finally, a gate conductive layer is formed to fill the opening.

14 Claims, 5 Drawing Sheets

(51) Int. Cl.
*H01L 29/423* (2006.01)
*H01L 29/49* (2006.01)
*H01L 29/78* (2006.01)
*H01L 21/263* (2006.01)
*H01L 29/40* (2006.01)

(52) U.S. Cl.
CPC ........ *H01L29/4983* (2013.01); *H01L 29/6653* (2013.01); *H01L 29/6656* (2013.01); *H01L 29/66583* (2013.01); *H01L 29/7833* (2013.01)

(56) References Cited

U.S. PATENT DOCUMENTS

| | | |
|---|---|---|
| 6,399,469 B1 | 6/2002 | Yu |
| 6,429,052 B1 | 8/2002 | Gardner |
| 6,432,781 B2 | 8/2002 | Wasshuber |
| 6,548,862 B2 | 4/2003 | Ryu |
| 6,596,599 B1 | 7/2003 | Guo |
| 6,661,066 B2 | 12/2003 | Kuroi |
| 6,764,910 B2 | 7/2004 | Ryu |
| 6,806,534 B2 | 10/2004 | Dokumaci |
| 6,891,235 B1 | 5/2005 | Furukawa |
| 6,894,357 B2 | 5/2005 | Guo |
| 6,984,860 B2 | 1/2006 | Grivna |
| 7,061,056 B2 | 6/2006 | Tsai |
| 7,084,025 B2 * | 8/2006 | Phua ................. H01L 21/26586 257/E21.202 |
| 7,091,551 B1 | 8/2006 | Anderson |
| 7,157,757 B2 | 1/2007 | Parekh |
| 7,208,361 B2 | 4/2007 | Shah |
| 7,314,776 B2 * | 1/2008 | Johnson ................. G06F 21/10 257/E31.029 |
| 7,479,684 B2 | 1/2009 | Guha |
| 7,517,746 B2 | 4/2009 | Lin |
| 7,723,196 B2 | 5/2010 | Guha |
| 8,048,790 B2 | 11/2011 | Soss |
| 8,329,546 B2 * | 12/2012 | Lee ................... H01L 21/28114 257/E21.19 |
| 2003/0030103 A1 | 2/2003 | Ryu |
| 2003/0235943 A1 | 12/2003 | Trivedi |
| 2004/0056304 A1 | 3/2004 | Ahmed |
| 2004/0084731 A1 | 5/2004 | Matsuda |
| 2004/0124479 A1 | 7/2004 | Takeshi |
| 2004/0132236 A1 | 7/2004 | Doris |
| 2004/0135212 A1 | 7/2004 | Dokumaci |
| 2005/0176191 A1 | 8/2005 | Kumar |
| 2006/0043503 A1 | 3/2006 | Parekh |
| 2007/0108530 A1 * | 5/2007 | Ogawa ........... H01L 21/823807 257/369 |
| 2007/0241396 A1 | 10/2007 | Yasutake |
| 2008/0185637 A1 | 8/2008 | Nagaoka |
| 2009/0212332 A1 | 8/2009 | Wang |
| 2011/0079854 A1 | 4/2011 | Lin |

* cited by examiner

SEMICONDUCTOR STRUCTURE HAVING A METAL GATE WITH SIDE WALL SPACERS

CROSS REFERENCE TO RELATED APPLICATIONS

This patent application is a divisional application of and claims priority to U.S. patent application Ser. No. 12/629,064, filed on Dec. 2, 2009, and entitled "SEMICONDUCTOR STRUCTURE HAVING A METAL GATE WITH SIDE WALL SPACERS" the entire contents of which are incorporated herein by reference.

BACKGROUND OF THE INVENTION

1. Field of the Invention

The present invention relates to a semiconductor structure having a metal gate and a method of forming the same, and more particular to a semiconductor structure having a broadened opening and a method of forming the same.

2. Description of the Prior Art

The performance of semiconductors has increased year after year with the critical dimensions and the advance of large-scale integrated circuits. In the field of semiconductor fabrication, since poly-silicon material has a strong heat resistance, the poly-silicon material is commonly used to fabricate the gate structure of the semiconductor structure, especially for the fabrication of the gate electrode of the metal oxide semiconductor transistor. In addition, the gate electrode made of poly-silicon may prevent dopings into the channel region during the ion implantation process. In addition, in the high-temperature environment, the poly-silicon gate electrode may endure high-temperature annealing processes, such that the self-aligned source region and drain region are formed. On the contrary, the poly-silicon gate still has many disadvantages which may not be conquered until now. Firstly, as compared with the poly-silicon material and most metal materials, poly-silicon material is a kind of semiconductor material having high electrical resistance, such that the operational speed of the poly-silicon gate electrode having high electrical resistance is still low with respect to the metal conducting line. In order to solve the problem of high electrical resistance and the corresponding low operational speed, the gate electrode made of poly-silicon material usually needs to utilize a silicide process step, such that the operational speed may be promoted to expected goals. Consequently, the forming of a semiconductor structure having the metal gate of the present invention becomes an important method for solving the aforementioned problems.

However, since line width of the semiconductor structure is minimized to a limitation, the integration process of the semiconductor structure having a metal gate has more challenges and problems. Please refer to FIG. 1 and FIG. 2, FIG. 1 and FIG. 2 are schematic diagrams illustrating the forming method of the semiconductor structure having a metal gate. As illustrated in FIG. 1, firstly, a semiconductor substrate 10 is provided. Subsequently, a gate structure 12 is formed on the semiconductor substrate 10, wherein the gate structure 12 includes a dummy patterned poly-silicon layer 12a and a patterned gate dielectric layer 12b. Then, a light doping source region 13 and drain region 13 is formed on the semiconductor substrate 10. The offset spacer 14 and the spacer 16 are formed on the peripheral side wall of the gate structure 12. Afterwards, a source region 18a and a drain region 18b are formed. Finally, a interlayer dielectric layer 17 is formed and a portion of the interlayer dielectric layer 17 on top of the dummy patterned poly-silicon layer 12a is removed by virtue of a chemical mechanical polishing/planarization (CMP) process, such that the exposed dummy patterned poly-silicon layer 12a is disposed in the well 19 defined by the offset spacer 14 and the patterned gate dielectric layer 12b.

Afterwards, as illustrated in FIG. 2, the dummy patterned poly-silicon layer 12a is etched to expose the well 19, and a work function layer 21 and a gate conductive layer 20 are directly deposited in the well 19, such that the gate conductive layer 20 serving as a metal gate is electrically connected to other metal interconnect lines to form a transmission route of the gate electrode electrical signals. Because the aspect ratio of the well 19 of the gate structure 12 of the semiconductor structure is a limitation especially when minimized to 28 nm, a preferred step converge is not provided according to the method of depositing the metal gate conductive layer nowadays, such that the problems of overhang or void may occur to seriously influence the filling quality of the gate conductive layer.

In view of this, the metal gate conductive layer of the conventional semiconductor structure having a metal gate has non-ideal drawbacks. In addition, the problems of void and overhang may not be solved according to the present manufacturing techniques.

SUMMARY OF THE INVENTION

One object of the present invention is to provide a semiconductor structure having a metal gate and a method of forming the same to improve the aforementioned problems.

In order to achieve the above-mentioned object, the present invention proposes a method of forming the semiconductor structure having a metal gate, and the method includes at least the following steps. Firstly, a semiconductor substrate is provided. Subsequently, at least a gate structure is formed on the semiconductor substrate. Afterwards, a spacer structure is formed to surround the gate structure. Then, an interlayer dielectric is formed. Afterwards, a planarization process is performed for the interlayer dielectric. Then, a portion of the sacrificial layer is removed to form an initial etching depth, such that an opening is formed to expose a portion of the spacer structure. The portion of the spacer structure exposed to the opening is removed so as to broaden the opening. Afterwards, remove the sacrificial layer completely via the opening. Finally, a gate conductive layer is formed to fill the opening.

In order to achieve the above-mentioned object, the present invention proposes a semiconductor structure having a metal gate. The semiconductor structure includes at least a semiconductor substrate, a gate structure, a first spacer and a second spacer. The gate structure is disposed on the semiconductor substrate. The semiconductor structure includes at least a gate dielectric layer and a gate conductive layer, wherein the gate conductive layer includes a first metal portion and a second metal portion, and the second metal portion covers the first metal portion. The first spacer is disposed on the peripheral side wall of the first metal portion, and the second metal portion covers the top of the first spacer. The second spacer is disposed on the peripheral side wall of the first spacer.

The semiconductor structure having a metal gate electrode and the method of forming the same of the present invention mainly utilizes the broadened opening formed by removing a portion of the first spacer to fulfill the fabrication of the gate conductive layer via the broadened opening. The semiconductor structure having a metal gate and the method of forming the same of the present invention may efficiently improve the overhang problem of the conventional metal gate fabrication, such that the problems of overhang or void are overcome when the gate conductive layer fills the well of the gate structure, such that the gate conductive layer may cover the inner wall of the gate structure uniformly and continuously. Also, the problems of overhang or void in the well may be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
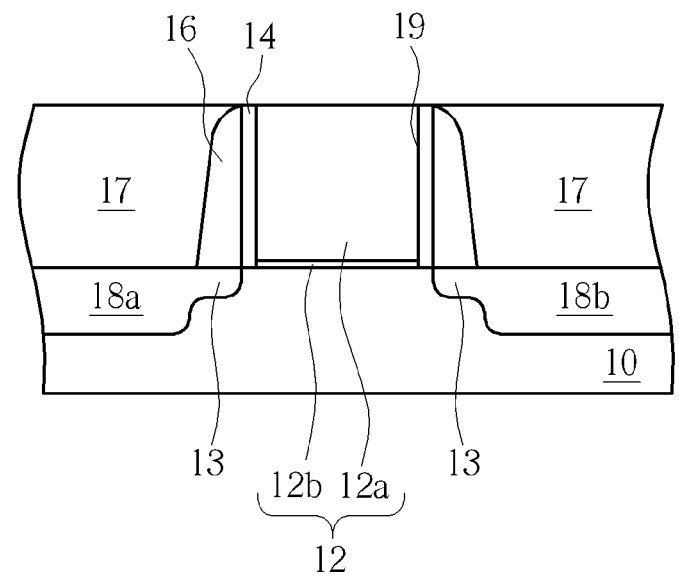
FIG. 1 and FIG. 2 are schematic diagrams illustrating the forming method of the semiconductor structure having a metal gate.
Figure 2:
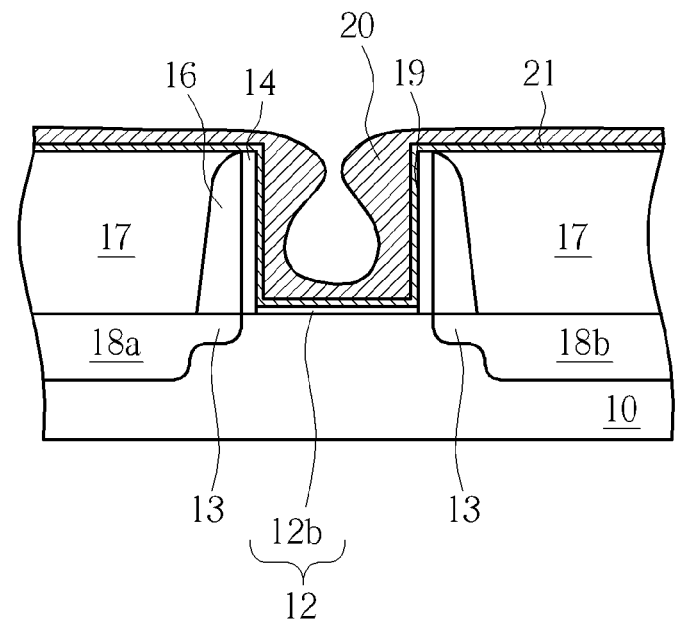
Figure 3:
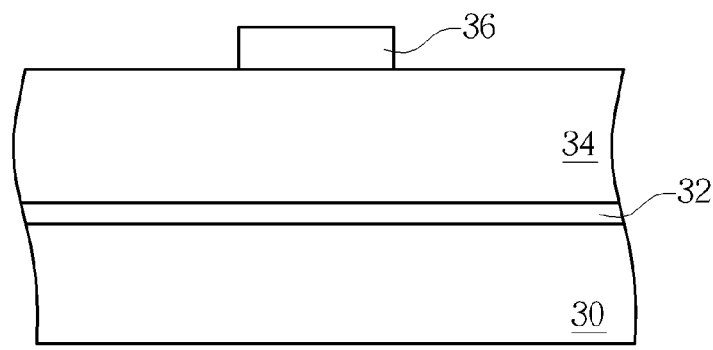
FIG. 3 to FIG. 9 are schematic diagrams illustrating the method of forming a semiconductor structure having a metal gate of the present invention.

Please refer to FIG. 3 to FIG. 9, FIG. 3 and FIG. 9 are schematic diagrams illustrating the method of forming a semiconductor structure having a metal gate of the present invention. As illustrated in FIG. 3, firstly, a semiconductor substrate is provided 30, and the material of the semiconductor substrate 30 may include silicon, silicon germanium (SiGe), epitaxy silicon or epitaxy germanium. Afterwards, a dielectric layer 32 and a poly-silicon layer 34 are sequentially formed on the semiconductor substrate 30, and the material of the poly-silicon layer 34 is made of the poly-silicon material which are undoped or having N+ or P+ dopants. Afterwards, a shielding layer (not shown in figure) is formed on the poly-silicon layer 34. Also, a patterned photoresist layer (not shown in figure) serves as a mask to perform a pattern process to form a patterned shielding layer 36. In addition, the patterned shielding layer 36 is made of silicon oxide (SiO2), silicon nitride (SiN), silicon carbanatye (SIC) or silicon oxynitride (SiON).

Figure 4:
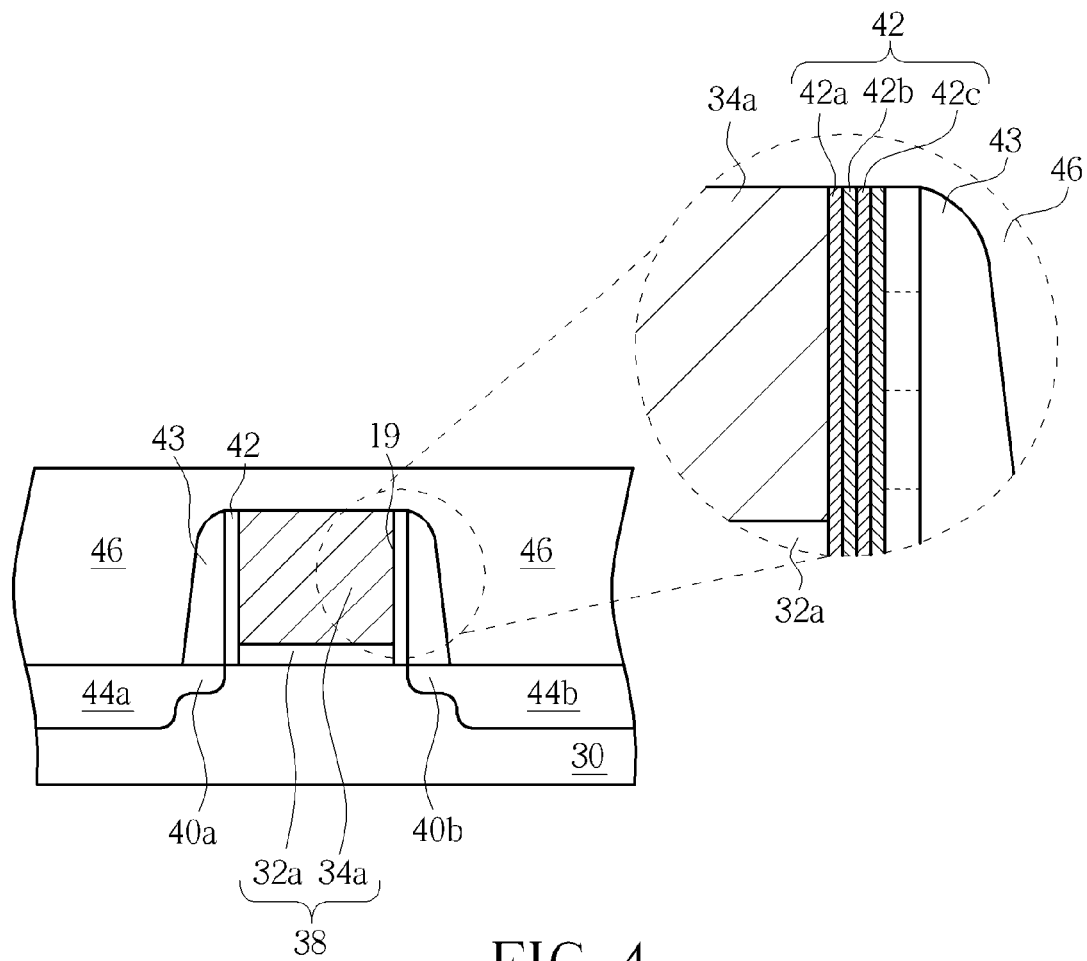

As illustrated in FIG. 4, the patterned shielding layer 36 is utilized to etch the dielectric layer 32 and the poly-silicon layer to form a gate dielectric layer 32a and a dummy patterned poly-silicon layer to form a gate structure 38. In this embodiment, it should be noted that since the dummy patterned poly-silicon layer is not the ultimate gate electrode, the dummy patterned poly-silicon layer serves as a sacrificial layer 34a. Also, the sacrificial layer may be other high-temperature endurable materials. Afterwards, the patterned shielding layer 36 is removed. In this embodiment, the material of the gate dielectric layer includes oxide, silicon oxide, silicon oxynitride (SiON), silicon nitride ($Si_3N_4$), tantalum pentoxide ($Ta_2O_5$), aluminum oxide ($Al_2O_3$), hafnium oxide (HfO), nitrous oxide, hafnium oxide, tantalum oxide, aluminum oxide and high dielectric constant materials (K>5), but not limited. The material of the gate dielectric layer 32a preferably should satisfy the characteristic of low gate leakage.

After forming the gate structure 38, the doping process is subsequently performed. For instance, a lightly doped ion implantation process is selectively performed, such that N type or P type dopants may be implanted into the semiconductor substrate 30 to form a lightly doped drain region 40a and a lightly doped source region 40b. Afterwards, a first spacer 42 is formed on the peripheral side wall of the gate structure 38 and a second spacer 43 is formed on the peripheral side wall of the first spacer 42. In this embodiment, the first spacer 42 may be a single layer material or include a plurality of substructure layers. Also, the preferable substructure layers are silicon oxide layers or silicon nitride layers arranged alternately. For instance, the substructure layers 42a, 42b, 42c are made of silicon oxide, silicon nitride or silicon oxide (ONO), but not limited. Also, the thickness of each of the substructure is substantially between 1 nm and 5 nm.

After forming the first spacer 42 and the second spacer 43, another heavily-doped ion implantation process is subsequently performed such that N type or P type dopants may be implanted into the semiconductor substrate 30 to form a drain region 44a and a source region 44b on the peripheral side wall of the second spacer 43 respectively. It should be noted that the process of forming the aforementioned source region 44a and the drain region 44b may selectively integrate strained epitaxial silicon, such that carrier mobility of the channel region may be improved. Also, the sequence of the related manufacturing process may be adjusted as required. Therefore, no more redundant description is provided here. Afterwards, a rapid thermal annealing process is performed at a temperature between 900 to 1050 t to activate the dopants within the source region 44a and the drain region 44b and repair the lattice structure of the semiconductor substrate 30 which has been damaged during the ion implantation process.

Subsequently, an interlayer dielectric layer 46 covers the gate structure 38, the source region 44a, the drain region 44b, the first spacer 42 and the second spacer 43, wherein the interlayer dielectric layer 46 may include nitrides oxides, carbides and low-K dielectric materials.

Figure 5:
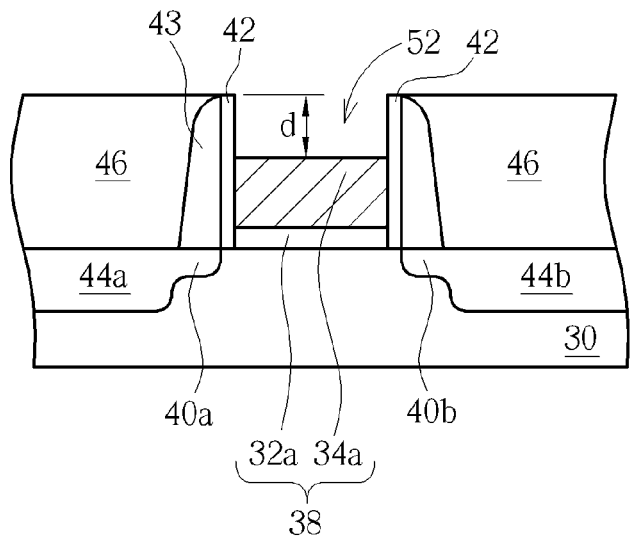

As illustrated in FIG. 5, the step of the planarization process is performed to remove a portion of the interlayer dielectric layer 46 on the top of the gate structure 38, such that the gate sacrificial layer 34a is exposed. Also, the exposed gate sacrificial layer 34a is substantially horizontal to the surface of interlayer dielectric layer 46, wherein the planarization step includes processes such as chemical mechanical polishing/planarization (CMP), dry etching process or wet etching process or the combined processes.

Then, a step of removing the exposed gate sacrificial layer 34a is performed. It should be noted that the dry etching process, the wet etching process or the combined process may be used to remove the gate sacrificial layer 34a. In the present embodiment, the removing of the gate sacrificial layer 34a preferably utilizes two steps of the etching process. As illustrated in FIG. 5, in the first step, the gate sacrificial layer 34a is etched to an initial etching depth d to form a first opening 52 and expose a portion of the first spacer 42. It should be noted that the initial etching depth d is preferable larger than half of the height of the gate sacrificial layer 34a. For instance, a wet etching process may be utilized for removal in the first step. For example, the etching solvents such as ammonium hydroxide or tetramethylammonium hydroxide may be utilized to remove a portion of the gate sacrificial layer 34a made of poly-silicon according to preferable time parameter and temperature parameter of the wet etching process, such that a first opening 52 is formed in the original gate structure 38. Also, the selective etching solvents are not limited, and the etching solvents may be any adequate etching solvents. In the present embodiment, it should be noted that the selected etching solvent has high etching selectivity to the gate sacrificial layer 34a and the first spacer 42. Thus, only a portion of the gate sacrificial layer 34a is removed and therefore the first spacer 42 is reserved.

Figure 6:
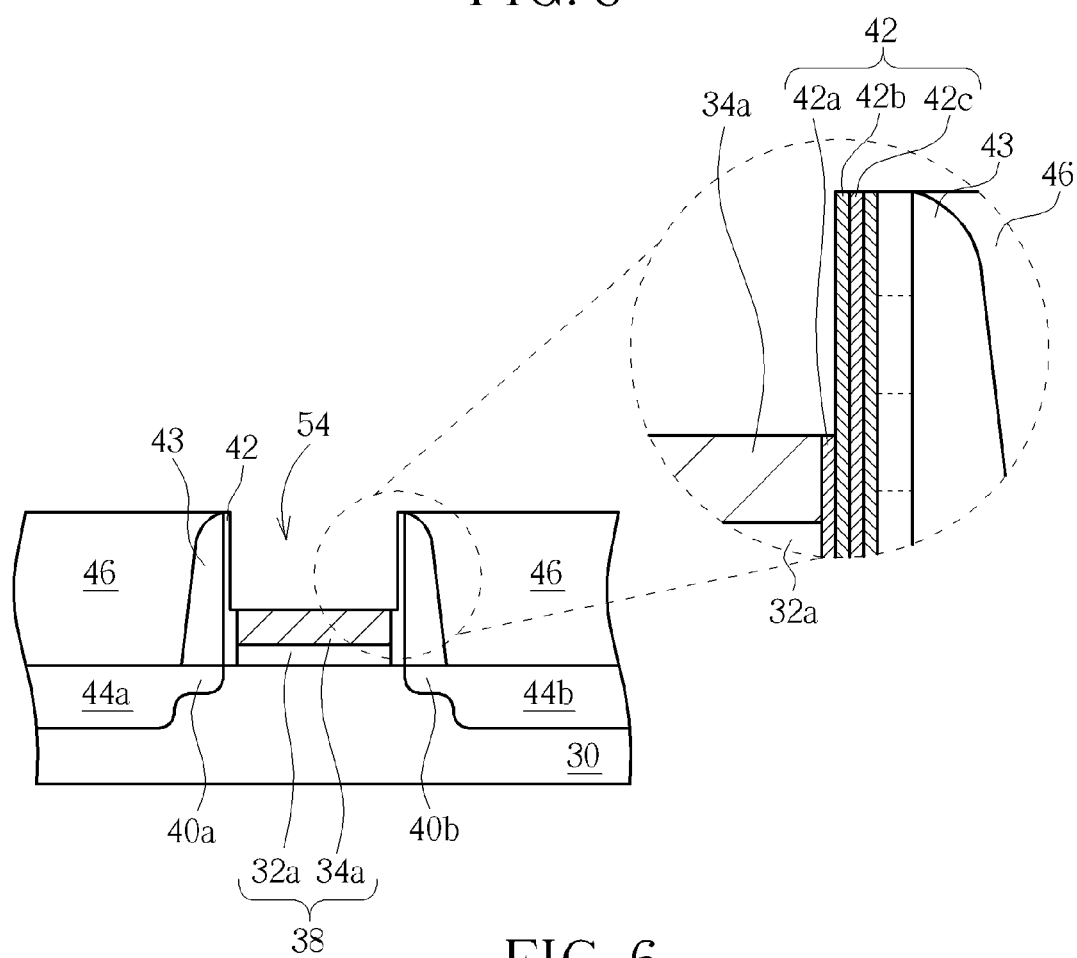

However, as illustrated in FIG. 6, in the second step, the first spacer 42 exposed to the first opening 52 is removed, so that the first opening 52 is broadened to form a second opening 54. In the embodiment, it should be noted that since the first spacer 42 has multilayer structures made of oxide layers and silicon nitride layers arranged in alternation. Also, the step of removing the first spacer 42 exposed to the first opening 52 includes the step of etching at least one substructure layer of the first spacer 42 having multilayer structure, for example, removing the oxide layer and a part of the silicon nitride layer. In another embodiment of the present invention, the first spacer 42 exposed to the first opening 52 is partially etched away till the initial etching depth d, that is, the portion of the first spacer 42 which is above the initial etching depth d is completely removed.

With reference to FIG. 6, the step of removing a portion of the first spacer 42 exposed to the first opening 52 includes selectively removing the substructure layers 42a, 42b, 42c of the first spacer 42, whereas the number of the substructure layers which are etched is not limited. Also, the etching depth of each of the substructure layers may be modified as required. For example, it should be noted that if the first substructure layer 42a of the first spacer 42 having multilayer structures is selectively etched, the etching depth of the first substructure layer 42a of the first spacer 42 is defined as a first etching length (not shown in figure), and the first etching length should be smaller or equal to the aforementioned initial etching depth d. Similarly, if the second substructure layer 42b of the first spacer 42 is selectively etched, the etching depth of the second substructure layer 42b of the first spacer 42 is defined as a second etching length (not shown in figure), and the second etching length is substantially smaller or equal to the aforementioned first etching length. In the same way, if the multilayer structures of the first spacer 42 having multilayer structures are selectively etched, the relationship of the etching lengths follows the same rule. Therefore, no more redundant description is provided here. If the initial etching depth d equals to the first etching length and the second etching length, the portion of the first spacer 42 which is above the initial etching depth d will be removed away. It is therefore that the broadened opening may be formed by etching each of the substructure layers to form non-equal lengths or equal lengths, such that the quality for forming the metal conductive layer subsequently may be improved.

Figure 7:
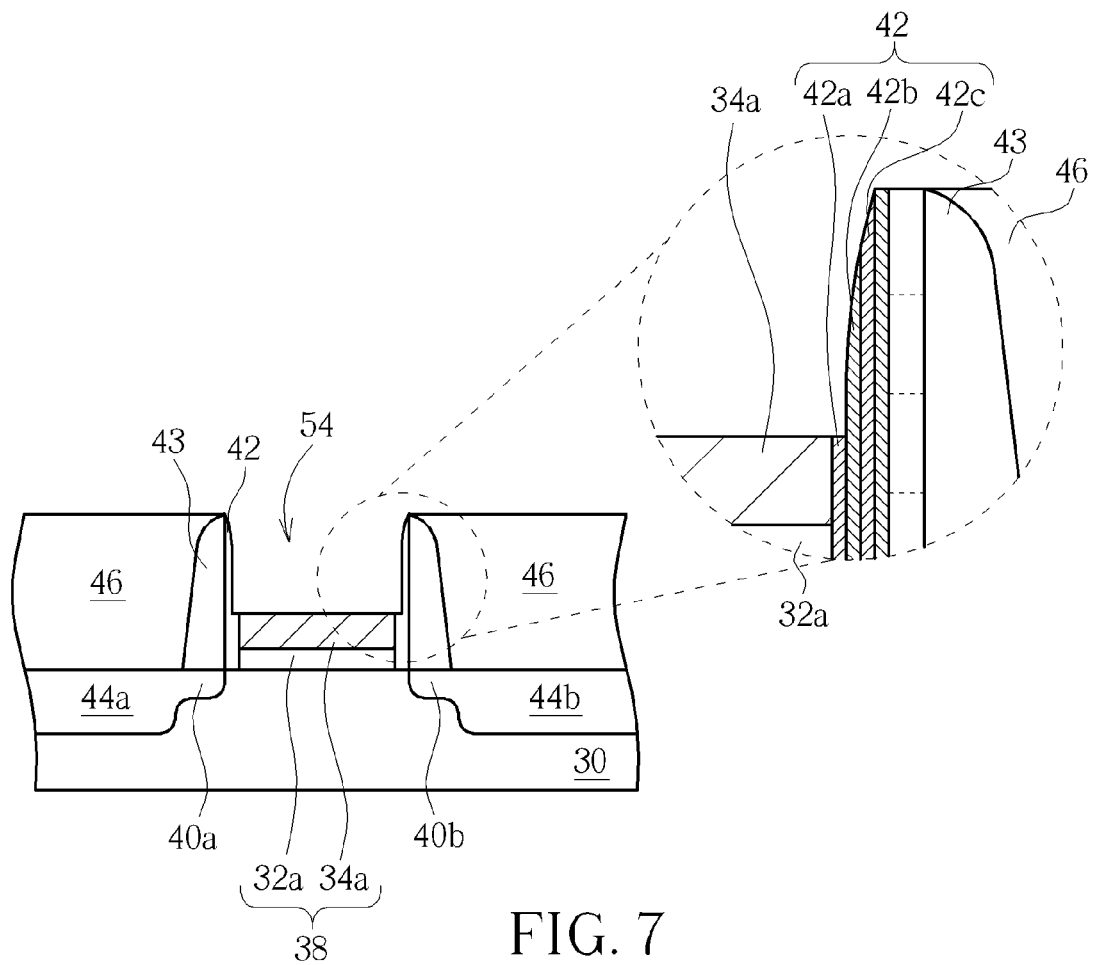

As illustrated in FIG. 7, FIG. 7 illustrates another preferred embodiment after FIG. 5. It should be noted that the step of removing a portion of the first spacer 42 exposed to the first opening 54 is to broaden the first opening 54 to forma second opening 54. In addition to the aforementioned etching process, in the second etching step, an ion bombardment step may be a substitute step or an additive step in the embodiment. For example, using both an etching process and an ion bombardment step, or directly using an ion bombardment step to replace the etching process, so that an anisotropic etching step is performed on the substructure layers 42a, 42b, 42c for forming a ramp structure. Thus, the second opening 54 becomes rounded and has a broadened opening.

Figure 8:
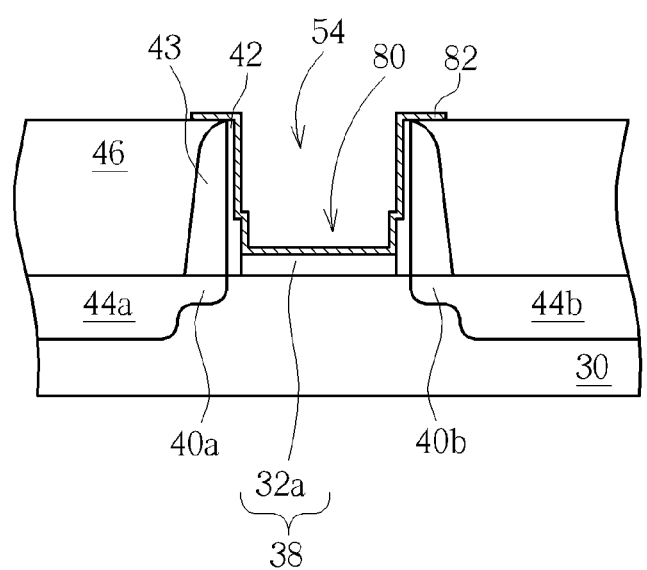

As illustrated in FIG. 8, next, a wet etching process is utilized to remove the residual gate sacrificial layer 34a to form a third opening 80. In the spatial relations, the width of the second opening 54 is substantially larger than that of the first opening 52 and that of the third opening 80. It should be noted that the gate dielectric layer 32a on the bottom of the third opening 80 is exposed when the third opening 80 is formed. Subsequently, a work function layer 82 is formed to cover the gate dielectric layer 32a and the surface of the first spacer 42. In the present embodiment, the goal for disposing the work function layer 82 is to match the energy state of the gate electrode of the semiconductor and the gate dielectric layer 32a. Also, the work function layer 82 may be made of N type work function layer 82 or P type work function layer 82 as required. For example, if an N type transistor is desired for fabrication, the selected material for work function layer may be material such as titanium nitride (TiN), tantalum carbide (TaC), tantalum nitride (TaN), tantalum-silicon-nitride (TaSiN), aluminum (Al), tantalum (Ta), titanium (Ti), titanium-aluminum (TiAl), titanium-aluminum-nitride (TiAlN) or hafnium (Hf). However, if a P type transistor is desired for fabrication, the selective material for work function layer may be material such as titanium nitride (TiN), tungsten (W), tungsten Nitride (WN), platinum (Pt), nickel (Ni), ruthenium (Ru), tantalum carbonitride (TaCN) or oxidized tantalum carbonitride (TaCNO). In the present embodiment, the work function layer is preferable made of ultra thin titanium nitride to satisfy the matching of work function energy level for both the N type transistor or P type transistor, and the thickness of the titanium nitride layer is substantially between 5 nm and 15 nm. Also, the ultra thin titanium nitride is preferable formed by an atomic layer deposition (ALD), such that the coating thickness may be precisely controlled to achieve high-quality step convergence and excellent thickness uniformity. Additionally, the titanium nitride layer may be a single layer structure and may have several modified embodiments according to the semiconductor structure design. Also, the titanium nitride layer may be a three-layer stack structure which includes a titanium layer, a titanium nitride layer and a second titanium layer. In addition, the titanium nitride layer may be a two-layer stack structure, whereas the way of stacking may be varied as required, but not limited.

Figure 9:
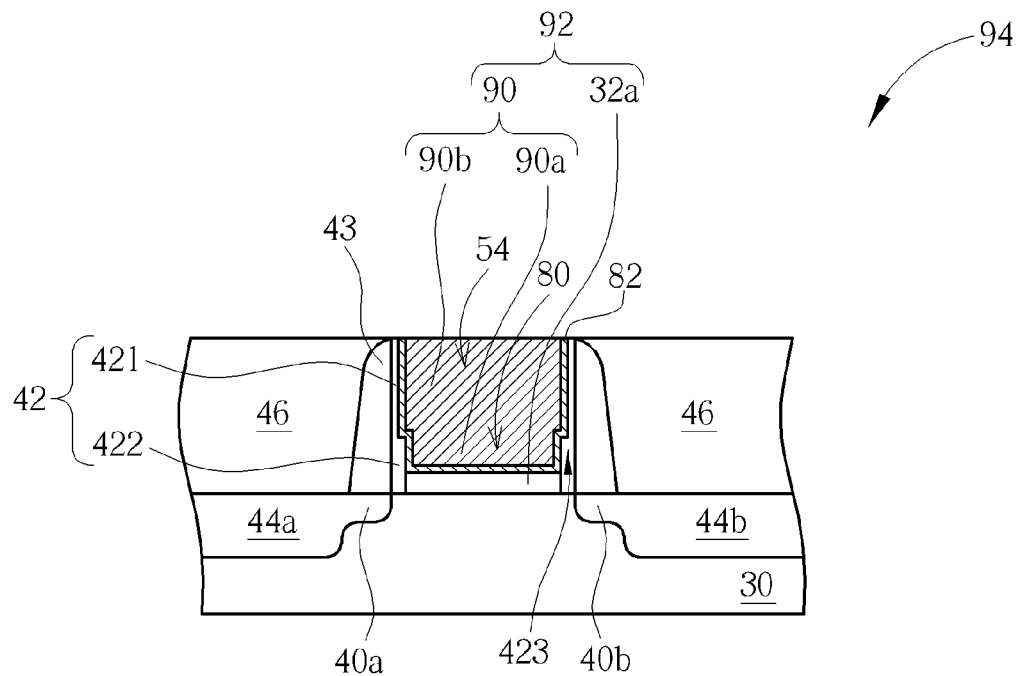

As illustrated in FIG. 9, afterwards, a gate conductive layer 90 fills the third opening 80 and the second opening 54. In this embodiment, the gate conductive layer 90 is preferably made of an aluminum metal layer, but may be made of a low-resistance material such as tungsten (W), titanium aluminum (TiAl) or cobalt tungsten phosphide (CoWP). Afterwards, another planarization process is selectively utilized to remove a portion of the gate conductive layer 90 covering the interlayer dielectric layer 46 and the work function layer 82, such that the gate conductive layer 90 after the removing step is substantially horizontal to the surface of the interlayer dielectric layer 46. Accordingly, the semiconductor structure 94 having a metal gate is formed.

Since FIG. 9 illustrates the ultimate diagram of the method of forming the semiconductor structure having a metal gate of the present invention, FIG. 9 is also a schematic diagram illustrating a preferred embodiment of the semiconductor structure having a metal gate of the present invention. As illustrated in FIG. 9, the semiconductor structure having a metal gate of the present invention includes a semiconductor substrate 30, a gate structure 92, a first spacer 42, a second spacer 43 and a work function layer 82. The gate structure 92 is disposed on the semiconductor substrate 30, the gate structure 92 includes at least a gate dielectric layer 32a and a gate conductive layer 90, and the first spacer 42 includes a plurality of substructure layers. Also, the thickness of each of the substructure layers is substantially between 1 nm and 5 nm. The gate conductive layer 90 includes a first metal portion 90a and a second metal portion 90b, and the second metal portion 90b covers the first metal portion 90a. In this embodiment, it should be noted that the work function layer 82 firstly covers and is disposed on the first spacer 42 and the gate dielectric layer 32a, then the work function layer 82 is disposed between the gate dielectric layer 32a and the first metal portion 90a. The gate conductive layer 90 firstly covers the work function layer 82. As for the use of the materials for the semiconductor structure having a metal gate, the material of the semiconductor substrate 30 includes silicon (Si), silicon germanium (SiGe), epitaxy silicon or epitaxy germanium. Also, the material of the gate dielectric layer includes oxide, silicon oxide, silicon oxynitride (SiON), silicon nitride ($Si_3N_4$), tantalum pentoxide ($Ta_2O_5$), aluminum oxide ($Al_2O_5$), hafnium oxide (HfO), nitrous oxide, hafnium oxide, tantalum oxide, aluminum oxide and high dielectric constant material (K>5).

Figure 10:
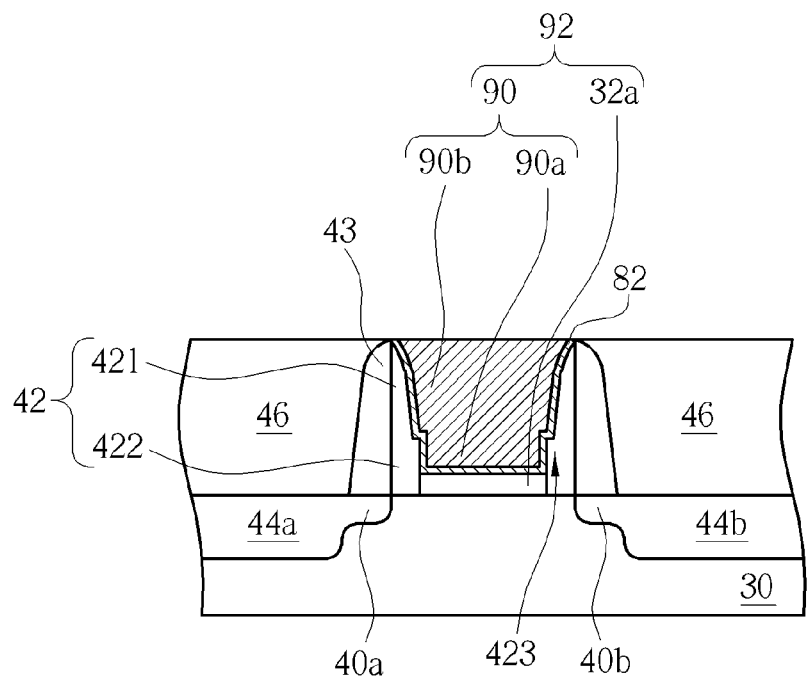
FIG. 10 is a schematic diagram illustrating another preferred embodiment of the semiconductor structure having a metal gate of the present invention.

In this embodiment, the work function layer 82 may be made of N type work function material or P type work function material as required, and the goal for disposing the work function layer 82 is to match the energy state of the gate conductive layer 90 and the gate dielectric layer 32a. As for the selected work function layer 82 material, for example, N type work function material may be a material such as titanium nitride (TiN), tantalum carbide (TaC), tantalum nitride (TaN), tantalum-silicon-nitride (TaSiN), aluminum (Al), tantalum (Ta), titanium (Ti), titanium-aluminum (TiAl), titanium-aluminum-nitride (TiAlN) or hafnium (Hf). On the contrary, for example, P type work function material may be a material such as titanium nitride (TiN), tungsten (W), tungsten Nitride (WN), platinum (Pt), nickel (Ni), ruthenium (Ru), tantalum carbonitride (TaCN) or oxidized tantalum carbonitride (TaCNO). In the present embodiment, it should be noted that the work function layer 82 is preferable made of titanium nitride, and the thickness of the titanium nitride layer is substantially between 5 nm and 15 nm. As for spatial arrangement of the semiconductor structure, the first spacer 42 is disposed on the peripheral side wall of the first metal portion 90a and disposed under the second metal portion 90b. Also, the second spacer 43 is disposed on the peripheral side wall of the second metal portion 90b and the first spacer 42. With reference to FIG. 10, FIG. 10 is a schematic diagram illustrating another preferred embodiment of the semiconductor structure having a metal gate of the present invention. The difference between FIG. 10 and FIG. 9 is that the side wall of the first spacer 42 illustrated in FIG. 10 has a ramp structure adjacent to the gate conductive layer 90, and the work function layer 82 covers the first spacer 42. In addition, the first metal portion 90a is disposed along the first spacer 42, and the second metal portion 90b covers the first metal portion 90a and the first spacer 42. Accordingly, in this embodiment, the first spacer 42 provides an outwardly broadened opening to fill the gate conductive layer 90. In addition, the identical elements in this embodiment are described and illustrated in the aforementioned FIG. 9, and no more redundant description is provided here.

In summary, the semiconductor structure of the present invention having a metal gate and the method of forming the same mainly utilizes the broadened opening formed by removing a portion of the first spacer to improve the fabrication of the gate conductive layer via the broadened opening. The semiconductor structure of the present invention having a metal gate electrode and the method of forming the same not only conquer the limitation of the aspect ratio of the well of the gate structure of the semiconductor structure having a metal gate but also provide a preferred step convergence opposite to the traditional deposition process. Also, the problems of overhang or void are overcome when the gate conductive layer fills the well of the gate structure, such that the quality for the forming of the gate conductive layer may be obviously improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure having a metal gate, the method comprising the following steps:
   providing a semiconductor substrate;
   forming at least a gate structure on the semiconductor substrate, the gate structure comprising a gate dielectric layer and a gate sacrificial layer;
   forming a spacer structure on a peripheral side wall of the gate structure;
   forming an interlayer dielectric layer covering the gate structure and the spacer structure;
   planarizing the interlayer dielectric layer to expose the gate sacrificial layer;
   removing a portion of the gate sacrificial layer to an initial etching depth to form an opening and expose a portion of the spacer structure, wherein the initial etching depth is at least larger than half of a height of the gate sacrificial layer in the step of removing the portion of the sacrificial layer to the initial etching step;
   after removing the portion of the gate sacrificial layer, removing a portion of the spacer structure exposed to the opening to broaden the opening;
   removing the gate sacrificial layer completely; and
   forming a gate conductive layer to fill the opening.

2. The method of claim 1, wherein the step of broadening the opening comprises an etching process.

3. The method of claim 1, wherein the step of broadening the opening comprises an ion bombardment process.

4. The method of claim 1, wherein the spacer structure comprises a first spacer and a second spacer, wherein the first spacer is disposed on the peripheral side wall of the gate structure and the second spacer is disposed on the peripheral side wall of the first spacer.

5. The method of claim 4, wherein the step of broadening the opening comprises partially removing the first spacer exposed to the opening till the initial etching depth.

6. The method of claim 4, wherein the first spacer comprises at least an oxide layer and at least a silicon nitride layer.

7. The method of claim 6, wherein the step of broadening the opening comprises removing the oxide layer and a part of the silicon nitride layer.

8. The method of claim 6, wherein a thickness of each of the oxide layers and the silicon nitride layers is substantially between 1 nm and 5 nm.

9. The method of claim 1, further comprising forming a work function layer before forming the conductive gate layer.

10. The method of claim 9, wherein the work function layer comprises an N-type work function metal material or a P type work function metal material.

11. The method of claim 10, wherein the N type work function metal material comprises titanium nitride (TiN), tantalum carbide (TaC), tantalum nitride (TaN), tantalum silicon nitride (TaSiN), aluminum (Al), tantalum (Ta), titanium (Ti), titanium-aluminum (TiAl), titanium-aluminum-nitride (TiAlN) or hafnium (Hf).

12. The method of claim 10, wherein the P-type work function metal material comprises titanium nitride (TiN), tungsten (W), tungsten nitride (WN), platinum (Pt), nickel (Ni), ruthenium (Ru), tantalum carbonitride (TaCN) or oxidized tantalum carbonitride (TaCNO).

13. The method of claim 9, wherein the work function layer is a titanium nitride layer.

14. The method of claim 13, wherein a thickness of the titanium nitride layer is substantially between 5 nm and 15 nm.

\* \* \* \* \*